United States Patent
Ohtoshi et al.

(10) Patent No.: US 8,188,443 B2
(45) Date of Patent: May 29, 2012

(54) FOCUSING METHOD OF CHARGED PARTICLE BEAM AND ASTIGMATISM ADJUSTING METHOD OF CHARGED PARTICLE

(75) Inventors: Kenji Ohtoshi, Kanagawa (JP); Hitoshi Sunaoshi, Kanagawa (JP); Osamu Iizuka, Kanagawa (JP); Takahito Nakayama, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 485 days.

(21) Appl. No.: 12/043,707

(22) Filed: Mar. 6, 2008

(65) Prior Publication Data

US 2008/0217553 A1   Sep. 11, 2008

(30) Foreign Application Priority Data

Mar. 7, 2007  (JP) ................. 2007-057900

(51) Int. Cl.
*H01J 3/14* (2006.01)

(52) U.S. Cl. ............... 250/396 R; 250/307; 250/310

(58) Field of Classification Search ............... 250/396 R
See application file for complete search history.

(56) References Cited

U.S. PATENT DOCUMENTS

| | | | |
|---|---|---|---|
| 5,627,373 A * | 5/1997 | Keese | 250/310 |
| 6,335,532 B1 * | 1/2002 | Tanaka et al. | 250/491.1 |
| 6,407,398 B1 * | 6/2002 | Kurokawa et al. | 250/492.22 |
| 7,126,120 B2 * | 10/2006 | Inada | 250/307 |
| 7,964,844 B2 * | 6/2011 | Kimba | 250/310 |
| 2003/0075691 A1 * | 4/2003 | Abe | 250/491.1 |

FOREIGN PATENT DOCUMENTS

| | | |
|---|---|---|
| JP | 9-293670 | 11/1997 |
| JP | 2004-273496 | 9/2004 |
| KR | 10-0202972 | 6/1999 |

* cited by examiner

*Primary Examiner* — Phillip A Johnston
(74) *Attorney, Agent, or Firm* — Oblon, Spivak, McClelland, Maier & Neustadt, L.L.P.

(57) ABSTRACT

A focusing method of a charged particle beam includes measuring a first set value to focus a beam on a position of a reference plane by using a lens coil, acquiring a first factor to change a set value of an electrostatic lens depending on a distance and a second factor to change a set value of the coil depending on a distance, measuring a level distribution of a target plane, correcting the first set value by using the second factor to correct a focal point position of the beam in the coil from the position of the reference plane to an intermediate level position of the level distribution of the target plane, and correcting a second set value of the lens depending on a level position of the target plane by using the first factor to correct a focal point position of the beam by the lens.

8 Claims, 9 Drawing Sheets

Related Art

FIG. 11

Related Art

Correction By
Electrostatic Focusing

Correction By
Electrostatic Focusing

FIG. 12

Related Art

FIG. 13

FOCUSING METHOD OF CHARGED PARTICLE BEAM AND ASTIGMATISM ADJUSTING METHOD OF CHARGED PARTICLE

CROSS-REFERENCE TO RELATED APPLICATION

This application is based upon and claims the benefit of priority from prior Japanese Patent Application No. 2007-057900 filed on Mar. 7, 2007 in Japan, the entire contents of which are incorporated herein by reference.

BACKGROUND OF THE INVENTION

1. Field of the Invention

The present invention relates to a focusing method of a charged particle beam and an astigmatism adjusting method of a charged particle beam, for example, a focusing method and an astigmatism adjusting method in an electron beam writing apparatus which irradiates an electron beam onto a target workpiece while variably shaping the electron beam.

2. Related Art

A lithography technique which bears the development of miniaturization of a semiconductor device is a very important process of semiconductor manufacturing processes. In recent years, with high-density integration of an LSI, a line width required for a semiconductor device is decreased every year. A lithography technique to form a desired circuit pattern on the semiconductor device requires an accurate original pattern (also called a reticle or a mask). In this case, an electron beam writing technique essentially has a high resolution and a high accuracy, and is used in production of the accurate original pattern.

Figure 11:
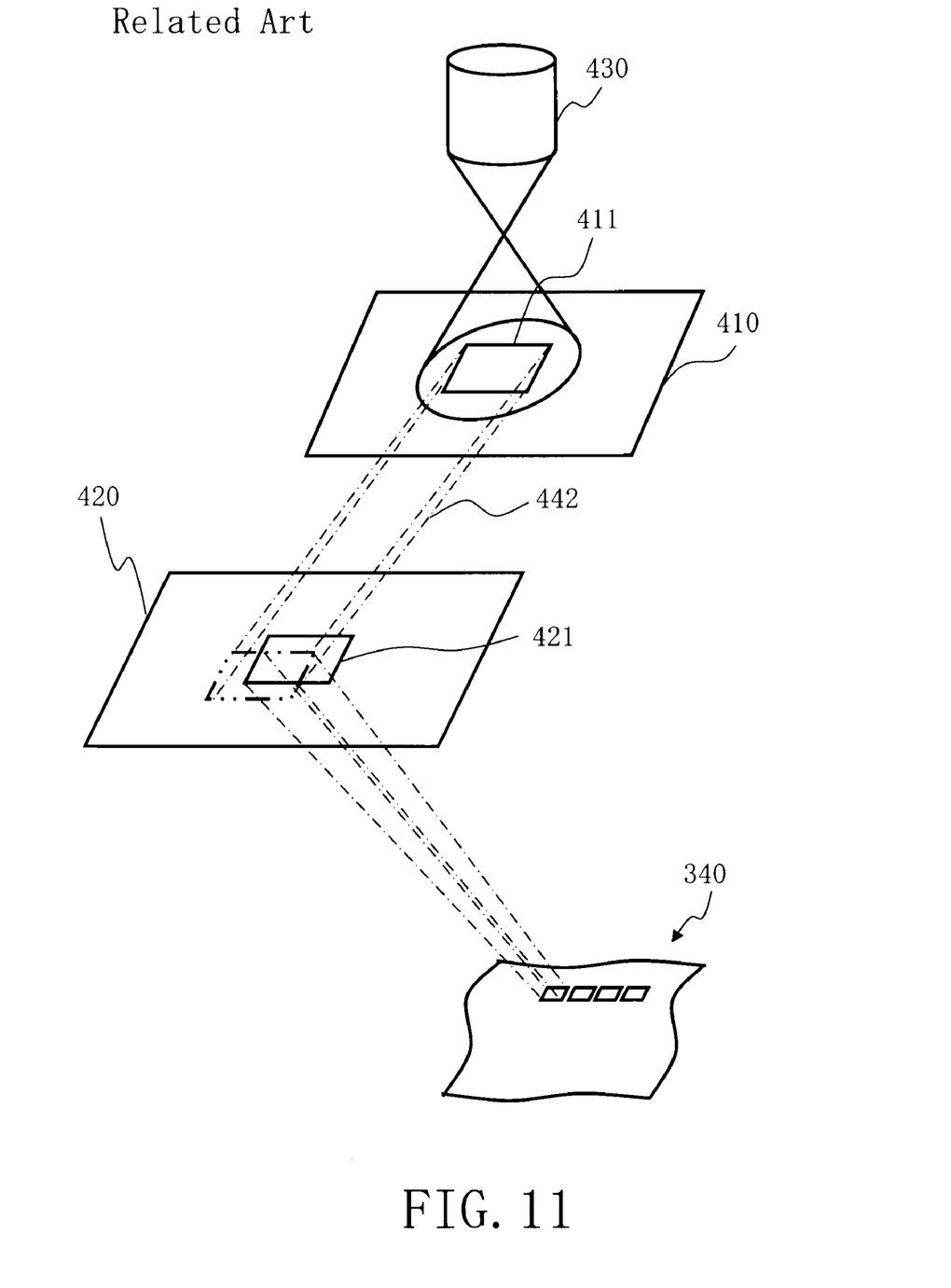
FIG. 11 is a conceptual diagram for explaining an operation of a conventional variable-shaped electron beam photolithography apparatus.

FIG. 11 is a conceptual diagram for explaining an operation of a conventional variable-shaping electron beam writing apparatus.

In the variable shaping electron beam (EB) writing apparatus, a pattern will be written as follows. In a first aperture plate 410, an oblong (for example, rectangular) opening 411 to shape an electron beam 330 is formed. In a second aperture plate 420, a variable shaping opening 421 to shape the electron beam 330 passing through the rectangular opening 411 into a desired oblong shape is formed. The electron beam 330 irradiated from a charged particle source 430 and passing through the rectangular opening 411 is deflected by a deflector. The electron beam 330 passes through apart of the variable shaping opening 421 and is irradiated on a target object 340 placed on a stage such that the electron beam 330 is focused by a coil lens or the like. At this time, the stage continuously moves in a predetermined direction (for example, an X direction). More specifically, an oblong shape which can pass through both the opening 411 and the variable shaping opening 421 is written in a writing region of the target object 340. A scheme which causes an electron beam to pass through both the opening 411 and the variable shaping opening 421 to form an arbitrary shape is called a variable shaping scheme. With respect to the variable shaping electron beam writing apparatus, disclosed documents are present (for example, see Published Unexamined Japanese Patent Application No. 9-293670(JP-A-9-293670)).

In the electron beam writing apparatus, a beam must be focused on the target object. An example of the focusing method will be described below.

Figure 12:
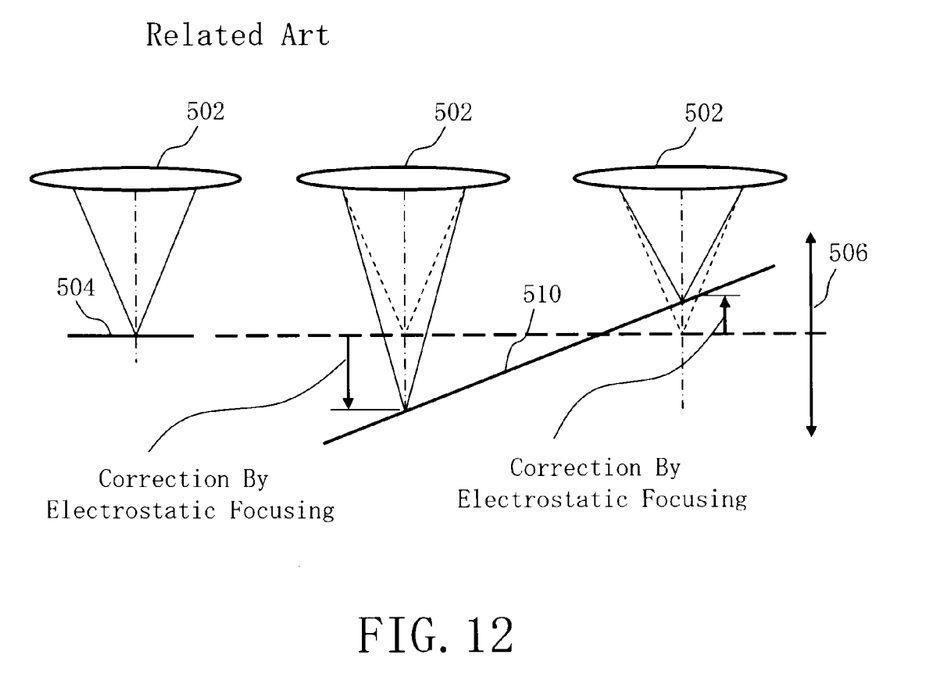
FIG. 12 is a diagram showing an example of a focusing method.

FIG. 12 is a diagram showing an example of the focusing method.

For example, a calibration mark 504 is independently prepared, an adjusting method which a beam is focused on a position of the calibration mark 504 by using a lens coil 502 is used. However, since a target object plane 510 is not always a plane, a level position of the calibration mark 504 is not equal to a level position of the entire surface of the target object plane 510, and an error generated by the inclination must be corrected. In general, an electromagnetic lens having a dynamic range is used in rough focal point adjustment. A remaining error is separately tried to be with high accuracy corrected at a high speed by using an electrostatic lens. However, with miniaturization of a pattern to be written, it is desired that the error be more accurately corrected. For this purpose, a resolution of the electrostatic lens must be improved. For this purpose, a dynamic range 506 of the electrostatic lens is advantageously narrowed. As shown in FIG. 12, when the entire surface of the target object plane 510 falls within the range of the dynamic range 506 of the electrostatic lens, focus adjustment can be performed by using the electrostatic lens.

Figure 13:
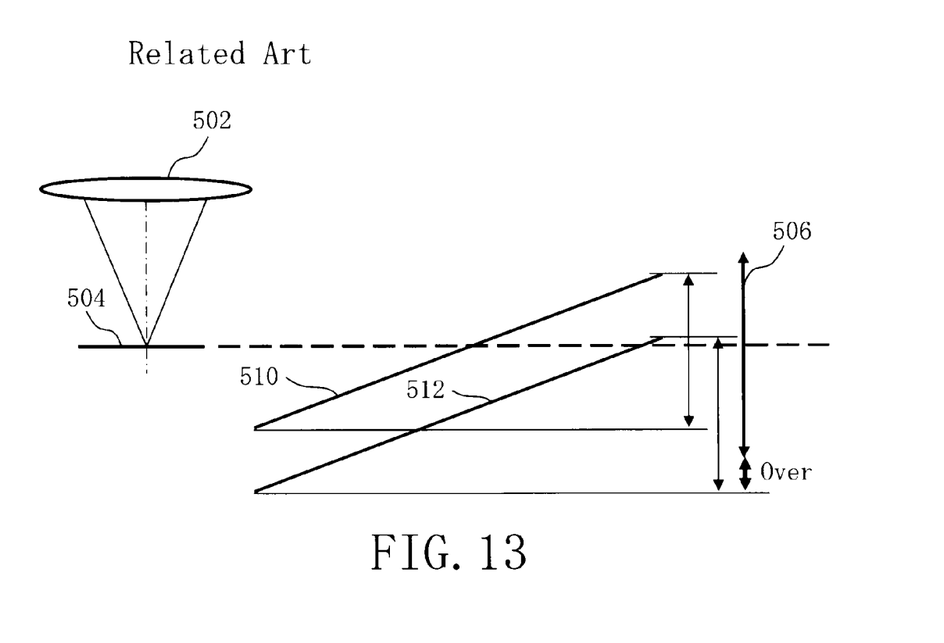
FIG. 13 is a diagram showing an example in which a target object plane falls out of a dynamic range of an electrostatic lens.

FIG. 13 is a diagram showing an example in which the entire surface of the target object plane 510 falls out of the dynamic range of the electrostatic lens.

With the dynamic range 506 narrowed, when a position serving as a reference for focusing a beam is the position of the calibration mark 504, depending on the inclination of the target object plane, as shown in FIG. 13, a part of the target object plane falls out of the dynamic range 506. FIG. 13 shows a state in which the target object plane 512 falls out of the dynamic range 506. When the target object plane 512 falls out of the dynamic range 506, a focal point cannot be corrected. For this reason, it is disadvantageously difficult to write an accurate pattern.

In an electron beam writing apparatus, even though a beam is focused, aberration correction, in particular, astigmatism adjustment must be performed. Even in the astigmatism adjustment, an adjusting method which adjusts an astigmatism at the position of the calibration mark 504 is used. However, as described above, since the target object plane is not always plane, a level position of the calibration mark is not always equal to a level position of the entire surface of the target object plane, and an error generated by the inclination must be corrected. The error is also tried to be accurately corrected by an electrostatic lens which is independently arranged. In this case, as described above, a part of the target object plane may fall out of the dynamic range. When the target object plane falls out of the dynamic range, astigmatism adjustment cannot be performed. For this reason, it is disadvantageously difficult to write an accurate pattern.

With miniaturization of a pattern to be written, a method of solving these problems is desired. However, this proposal provides a method to use a dynamic range of an electrostatic lens as efficiently as possible.

BRIEF SUMMARY OF THE INVENTION

The present invention has an object to provide a focusing method which can perform focusing of a target object plane by an electrostatic lens and an astigmatism adjusting method which can perform astigmatism adjustment.

A focusing method of a charged particle beam according to an embodiment of the present invention includes:

measuring a first set value to focus a charged particle beam on a position of a predetermined reference plane by using a lens coil;

acquiring a first conversion factor to change a set value of an electrostatic lens depending on a distance and a second conversion factor to change a set value of the lens coil depending on a distance by using the electrostatic lens and the lens coil;

measuring a level distribution of a target object plane;

correcting the first set value by using the second conversion factor to correct a focal point position of the charged particle beam in the lens coil from the position of the predetermined reference plane to an intermediate level position of the level distribution of the target object plane; and correcting a second set value of the electrostatic lens depending on a level position of the target object plane by using the first conversion factor to correct a focal point position of the charged particle beam by the electrostatic lens.

An astigmatism adjusting method of a charged particle beam according to an embodiment of the present invention includes:

measuring a first set value to correct an astigmatism of the charged particle beam at a predetermined mark position by using an astigmatism adjusting coil;

acquiring a first conversion factor to change a set value of an electrostatic electrode depending on a distance and a second conversion factor to change a set value of the astigmatism adjusting coil depending on a distance by using the electrostatic electrode and the astigmatism adjusting coil;

measuring a level distribution of a target object plane;

correcting the first set value by using the second conversion factor to correct an astigmatism adjusting position of the charged particle beam in the astigmatism adjusting coil from the predetermined mark position to an intermediate level position of the level distribution of the target object plane; and correcting a second set value of the electrostatic electrode depending on the level position of the target object plane by using the first conversion factor to correct an astigmatism of the charged particle beam by the electrostatic electrode.

DETAILED DESCRIPTION OF THE INVENTION

In the following embodiments, as an example of a charged particle beam, a configuration using an electronic beam will be described below. The charged particle beam is not limited to an electronic beam. A beam such as an ion beam using charged particles may be used.

First Embodiment

Figure 1:
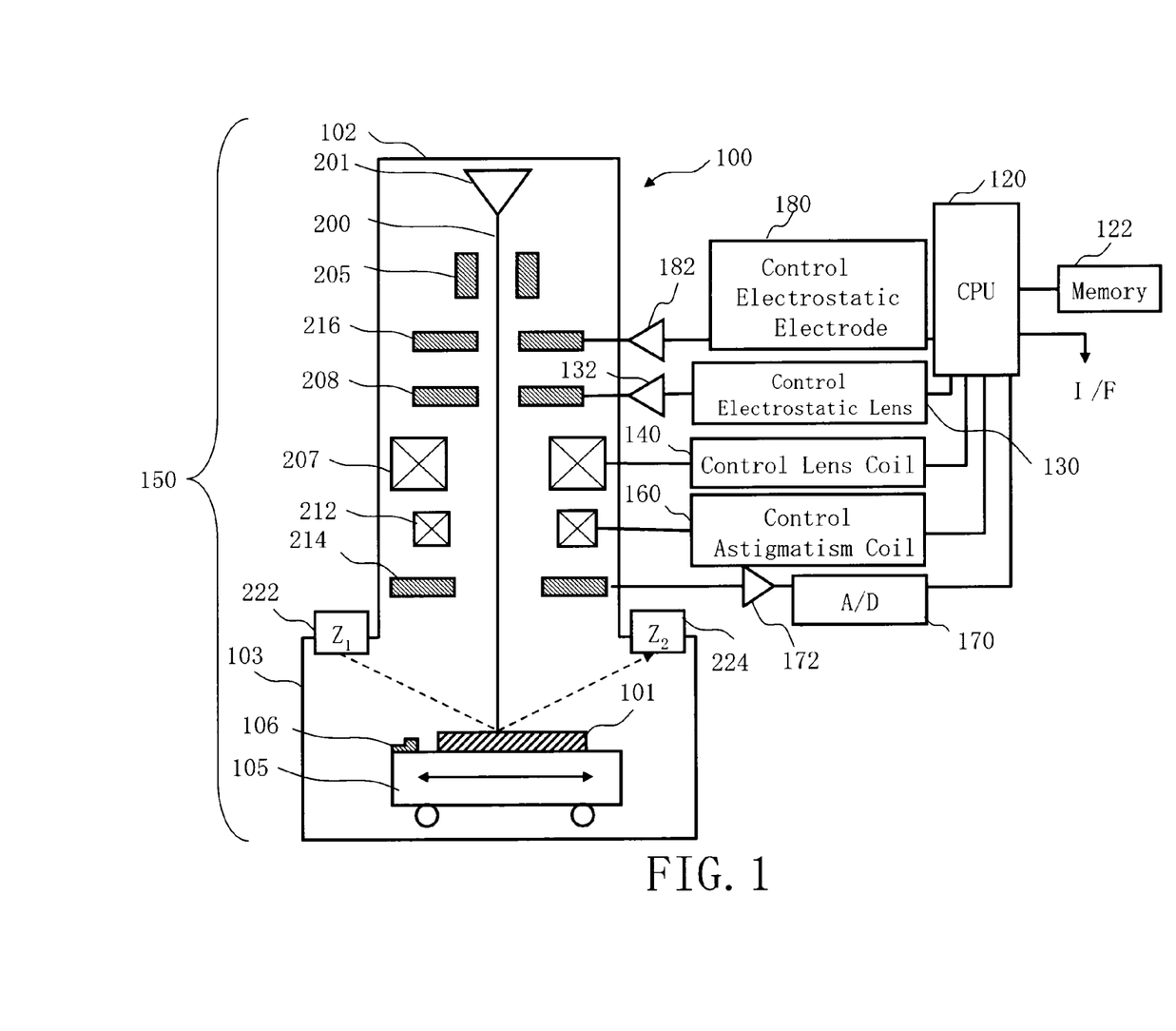
FIG. 1 is a conceptual diagram showing a configuration of a pattern writing apparatus according to the first embodiment.

FIG. 1 is a conceptual diagram showing a configuration of a pattern writing apparatus according to the first embodiment.

In FIG. 1, a pattern writing apparatus 100 serving as an example of a charged particle beam writing apparatus includes a pattern writing unit 150 and a control system. The pattern writing apparatus 100 writes, or "draws" a pattern onto a target object 101, or "a target workpiece 101". The target object 101 includes a mask for manufacturing a semiconductor device. The pattern writing unit 150 has an electron lens barrel 102 and a pattern writing chamber 103 connected to the electron lens barrel 102. In the electron lens barrel 102, an electron gun assembly 201, a deflector 205, a lens coil (OLF) 207, an electrostatic lens 208, an astigmatism coil 212 for astigmatism adjustment, an electrostatic electrode 216, and main deflector 214 are arranged. In the pattern writing chamber 103 an XY stage 105 is arranged. A target object 101 is placed on the XY stage 105. A calibration mark member 106 is arranged on the XY stage 105. On the pattern writing chamber 103, a Z sensor unit constituted by a projection unit 222 and a light-receiving unit 224. The control system includes a control calculator (CPU) 120, a memory 122, an electrostatic lens control unit 130, a lens coil control unit 140, an astigmatism coil control unit 160, an analog digital (A/D) converter 170, an electrostatic electrode control unit 180, and amplifiers 132, 172, and 182. Signal data input to the CPU 120 or output from the CPU 120 is stored in the memory 122. A calculation result in the CPU 120 is stored in the memory 122 every calculation. The calculation result or the input data in the CPU 120 can be output or input through an external interface (I/F). In FIG. 1, constituent parts necessary for explaining the first embodiment is described. The pattern writing apparatus 100 may include other configurations.

Figure 2:
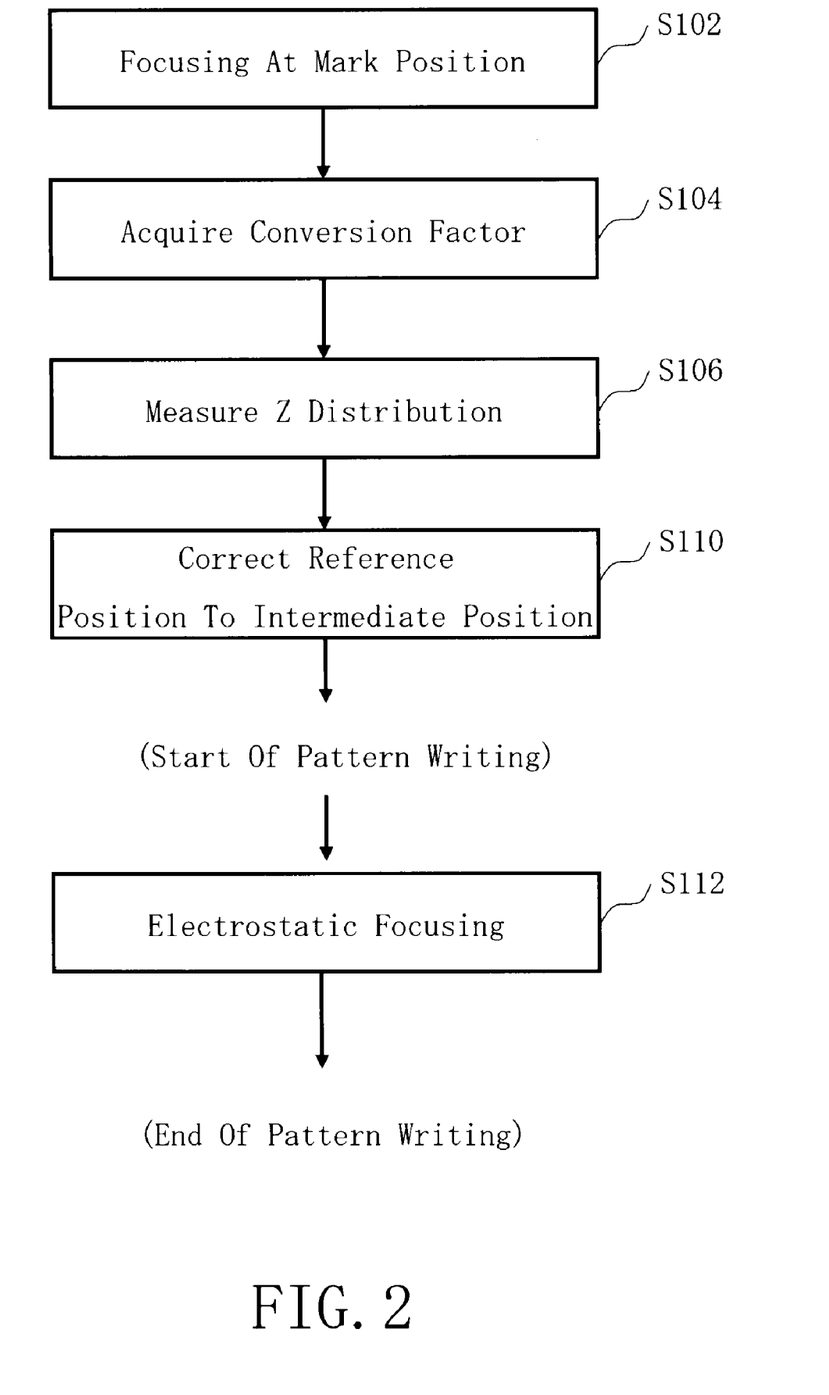
FIG. 2 is a flow chart showing main steps of a focusing method of an electron beam in the first embodiment.

FIG. 2 is a flow chart showing main steps of a focusing method of an electron beam in the first embodiment.

In FIG. 2, the focusing method of an electron beam executes a series of processes including a focusing step (S102) at a calibration mark position, a conversion factor acquiring step (S104), and an electrostatic focusing step (S112).

In step (S) 102, as the focusing step at the calibration mark position, an electron beam 200 is focused on the calibration mark position by using the lens coil 207. For this purpose, an OLF set value (first set value) to focus the electron beam on the focal point position is measured (set value measuring step).

Figure 3:
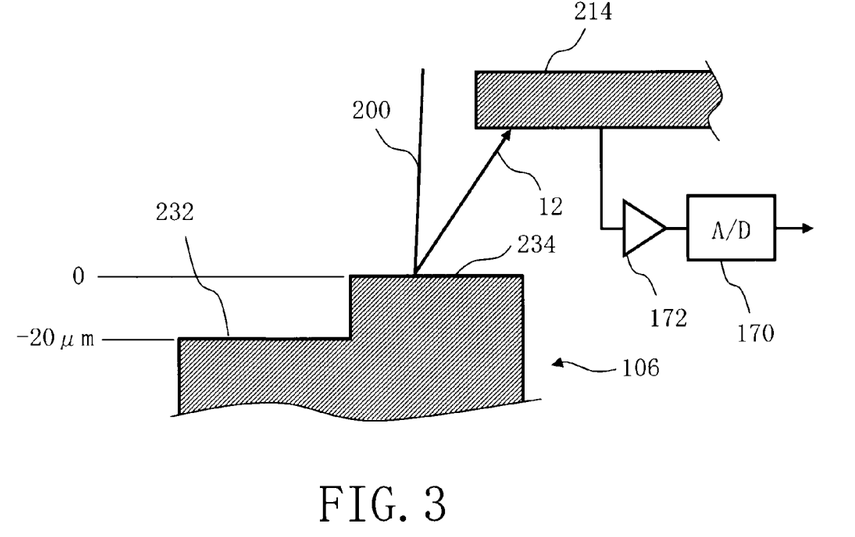
FIG. 3 is a conceptual diagram for explaining a measuring method in the first embodiment.

FIG. 3 is a conceptual diagram for explaining a measuring method in the first embodiment.

In this case, the calibration mark member 106 includes two planes 232 and 234 having different levels. The plurality of planes 232 and 234 having different levels in the calibration mark member 106 are examples of predetermined reference planes. In FIG. 3, although two planes are used, three ore more planes may be used. In FIG. 3, the plane 234 is used as a reference plane. The plane 232 may be used as the reference plane. The BLK aperture plate 232 is formed at a level position lower than the plane 234 by, for example, 20 μm. In this case, the step of the two planes is desirably set to be larger than a dynamic range of the electrostatic lens 208. Calibration marks are formed on the planes, respectively. The lens coil 207 focuses the electron beam 200 on the plane 234. More specifically, the electron beam 200 is irradiated from the electron gun assembly 201. A current signal set to be an arbitrary set value is flowed from the lens coil control unit 140 controlled by the CPU 120 to the lens coil 207. The lens coil 207 is controlled by the current signal. A focal point level of the electron beam 200 is controlled by a coil operation by the flowed current. In this state, the electron beam 200 is deflected by the deflector 205 to pass through the upper side of the calibration mark to measure a beam profile of the calibration mark. Alternatively, the XY stage 105 is moved to measure the beam profile of the calibration mark. More specifically, the calibration mark is scanned to measure the beam profile of the calibration mark. The beam profile can be measured such that reflected electrons 12 or secondary electrons emitted by irradiating the electron beam 200 on the calibration mark are detected by the reflective electron detector 214. An output signal from the reflective electron detector 214 is amplified by the amplifier 172 and converted into a digital signal by the A/D converter 170. The output is output to the CPU 120. A beam profile can be acquired on the basis of the measured data. The lens coil 207 is rendered conductive by a plurality of set values to acquire a beam profile by the same manner as described above.

Figure 4:
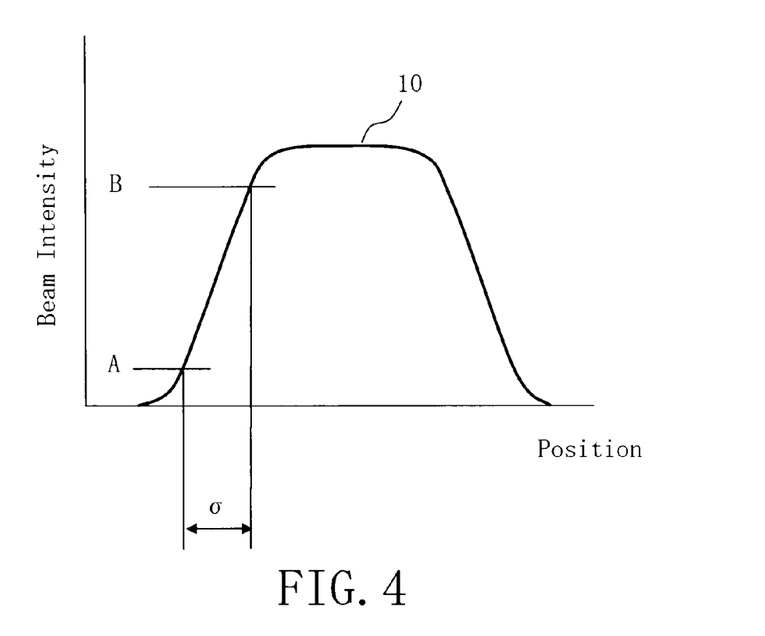
FIG. 4 is a diagram showing an example of a beam profile in the first embodiment.

FIG. 4 is a diagram showing an example of the beam profile in the first embodiment.

A set value obtained in a beam profile having a resolution σ in beam profiles 10 obtained as described above is an OLF set value obtained when the beam is focused. In this case, the resolution σ may be arbitrarily defined. However, the resolution σ may be defined in a range (length) from a position where the maximum beam intensity is 10% to a position where the maximum beam intensity is 90% or a range (length) from a position where the maximum beam intensity is 20% to a position where the maximum beam intensity is 90%.

Figure 5:
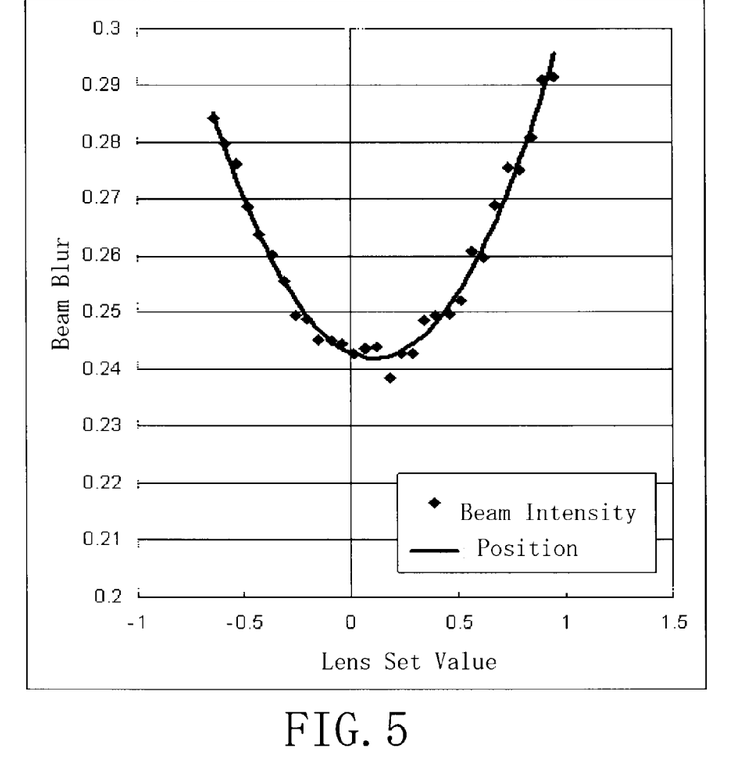
FIG. 5 is a graph showing a relationship between a lens set value and beam blur in the first embodiment.

FIG. 5 is a graph showing a relationship between a lens set value and beam blur in the first embodiment.

In FIG. 5, the resolution a is described to be defined as beam blur. As shown in FIG. 5, when measurement is performed, a lens set value obtained when the beam blur is minimum is an OLF set value to focus the beam.

In S104, as the conversion factor acquiring step, a first conversion factor to change a set value of the electrostatic lens 208 depending on a distance and a second conversion factor to change a set value of the lens coil 207 depending on a distance are acquired. For this purpose, by using the lens coil 207, a set value to focus the beam on the positions of the planes 232 and 234 of the calibration mark member 106 are measured. The set value to focus the beam on the position of the plane 234 of the lens coil 207 is calculated in advance. For this reason, a set value to focus the beam on the position of the remaining plane 232 is measured. In the measuring method, an operation having the same contents as described above is performed on the plane 232 to acquire a set value obtained when the electron beam 200 is focused on the plane 232. In this manner, a set value a1 on the plane 234 and a set value a2 on the plane 232 are acquired. As described above, the OLF set values a1 and a2 can be acquired. A conversion factor k1 of the lens coil 207 can be calculated as $k1=(a1-a2)/20$.

The electron beam 200 is focused on the position of the plane 234 by the electrostatic lens 208. The electron beam 200 is irradiated from the electron gun assembly 201. A voltage signal set to an arbitrary set value by the electrostatic lens control unit 130 controlled by the CPU 120 is amplified by the amplifier 132 and applied to the electrostatic lens 208. The electrostatic lens 208 is controlled by the voltage signal. A focal point level of the electron beam 200 is controlled by an electrostatic operation performed by the applied voltage. In this case, the focal point level may be adjusted to a position adjacent to the focal point of the plane 234 by using lens coil 207 to some extent in advance. In this case, the electron beam is scanned by the deflector 205 to measure a beam profile of the calibration mark. A method of measuring a beam profile is the same as the method of measuring a beam profile by the lens coil 207. Voltages having a plurality of set values are applied to the electrostatic lens 208 to acquire beam profiles by the same manner as described above. A set value obtained in a beam profile having the minimum resolution a in the acquired beam profiles is an electrostatic set value obtained when the beam is focused. In this case, although measurement is desired to be performed on the plane 232 by the same manner as described above, the plane 232 is over the dynamic range. For this reason, the lens coil 207 changes the focal point position by, for example, 10 μm which is smaller than the step between the planes 232 and 234. Since the conversion factor k1 of the lens coil 207 is obtained in advance, the lens coil 207 can change the focal point position by only 10 μm. In this state, the electron beam is scanned by the deflector 205 to measure the beam profile of the calibration mark. A set value obtained when the electron beam 200 is focused on the plane 234 is acquired. In this manner, a set value b1 on the plane 234 and a set value b2 at the position which is moved by only 10 μm are acquired. As described above, the electrostatic set values b1 and b2 can be acquired. A conversion factor k2 of the electrostatic lens 208 can be calculated as $k2=(b1-b2)/10$.

As described above, the conversion factor k2 is acquired by using a set value to focus a charged particle beam on a predetermined reference plane by using an electrostatic lens. The conversion factor k1 is acquired by using a set value to focus a charged particle beam on a predetermined reference plane by using a lens coil.

In S106, as a Z distribution measuring step, a level distribution of the target object 101 plane is measured by a Z sensor. The XY stage 105 is moved such that the plane 234 of the calibration mark member 106 set at a reference level is located at a center position of an optical axis. In this state, a laser beam is irradiated from the projection unit 222 onto the plane 234, and a reflected beam from the plane 234 is received by the light-receiving unit 224. An output signal from the light-receiving unit 224 is output to the CPU 120. A level of the plane 234 is defined as a reference value in a Z direction. Levels are similarly measured at a plurality of positions almost equally allocated in a drawing region on the target object 101 plane. With this operation, the Z distribution of the target object 101 plane can be obtained.

In S110, as the reference position correcting step, the set value a1 is corrected by using the conversion factor k1 to correct a focal point position of the electron beam 200 in the lens coil 207 from the position of the plane 234 of the calibration mark member 106 to an intermediate level position (virtual plane) of the Z distribution of the target object 101 plane. A product of the conversion factor k1 and a distance AZ is added to the set value a1, a correction value a3 can be obtained. The intermediate level position is set to an intermediate position of the dynamic range of the electrostatic lens 208.

Figure 6:
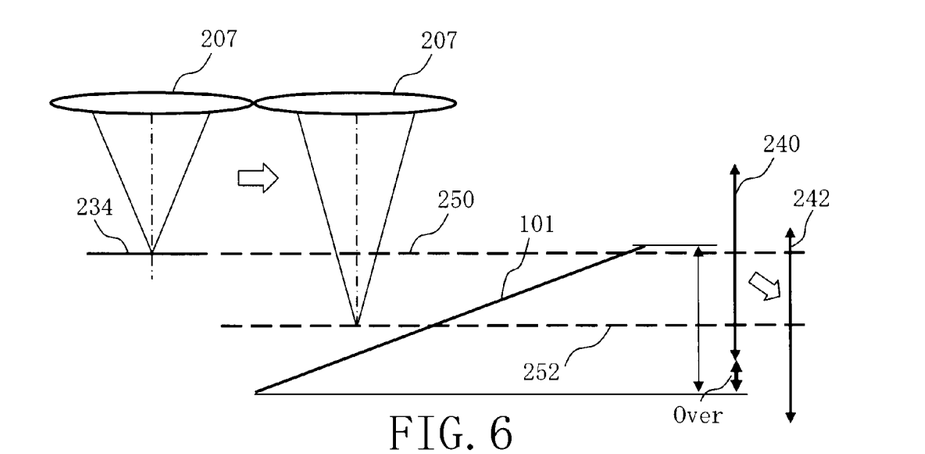
FIG. 6 is a diagram showing a relationship between a focus position and a dynamic range in the first embodiment.

FIG. 6 is a diagram showing a relationship between a focus position and a dynamic range in the first embodiment.

As described above, a focal point position of the electron beam 200 in the lens coil 207 is corrected from a level position 250 of the plane 234 to an intermediate level position 252, and the position is defined as a reference position, so that a dynamic range 240 of the electrostatic lens 208 can be moved to the position of a dynamic range 242. For this reason, even though the target object 101 plane is inclined, the entire surface can be caused to fall within the range of the dynamic range 242 of the electrostatic lens 208. In this state, pattern writing is started.

In S112, as the electrostatic focusing step, a level of a position of the target object 101 plane to be written is measured by the Z sensor, and a set value (second set value) of the electrostatic lens 208 is corrected by using the conversion factor k2 depending on the level position of the target object 101 plane. In this manner, a focal point position of the electron beam 200 is dynamically corrected by the electrostatic lens 208. Since the conversion factor k2 of the electrostatic lens 208 is known in advance, an electrostatic set value $\Delta b$ which moves the position of the target object 101 surface from the intermediate level position 252 by a heightwise distance $\Delta Z$ can be given by $\Delta b = k2 \cdot \Delta Z$.

With the above configuration, the position of the target object 101 plane can be arranged within the range of the dynamic range of the electrostatic lens 208. For this reason, the focal point position can be adjusted depending on the positions of the target object 101 plane. Therefore, the electrostatic lens 208 can correct the focal point position on real time while writing a predetermined pattern on the target object 101. As a result, a pattern having accurate dimensions can be written.

Second Embodiment

In the first embodiment, the focusing operation is described. However, in an electron beam writing apparatus, correction of deflection aberration, in particular, astigmatism adjustment may be further required even though a beam is focused. Even in the astigmatism adjustment, the same method as that in the first embodiment can be used. The method will be described below with reference to the accompanying drawings. The apparatus configuration is the same as that in the first embodiment.

Figure 7:
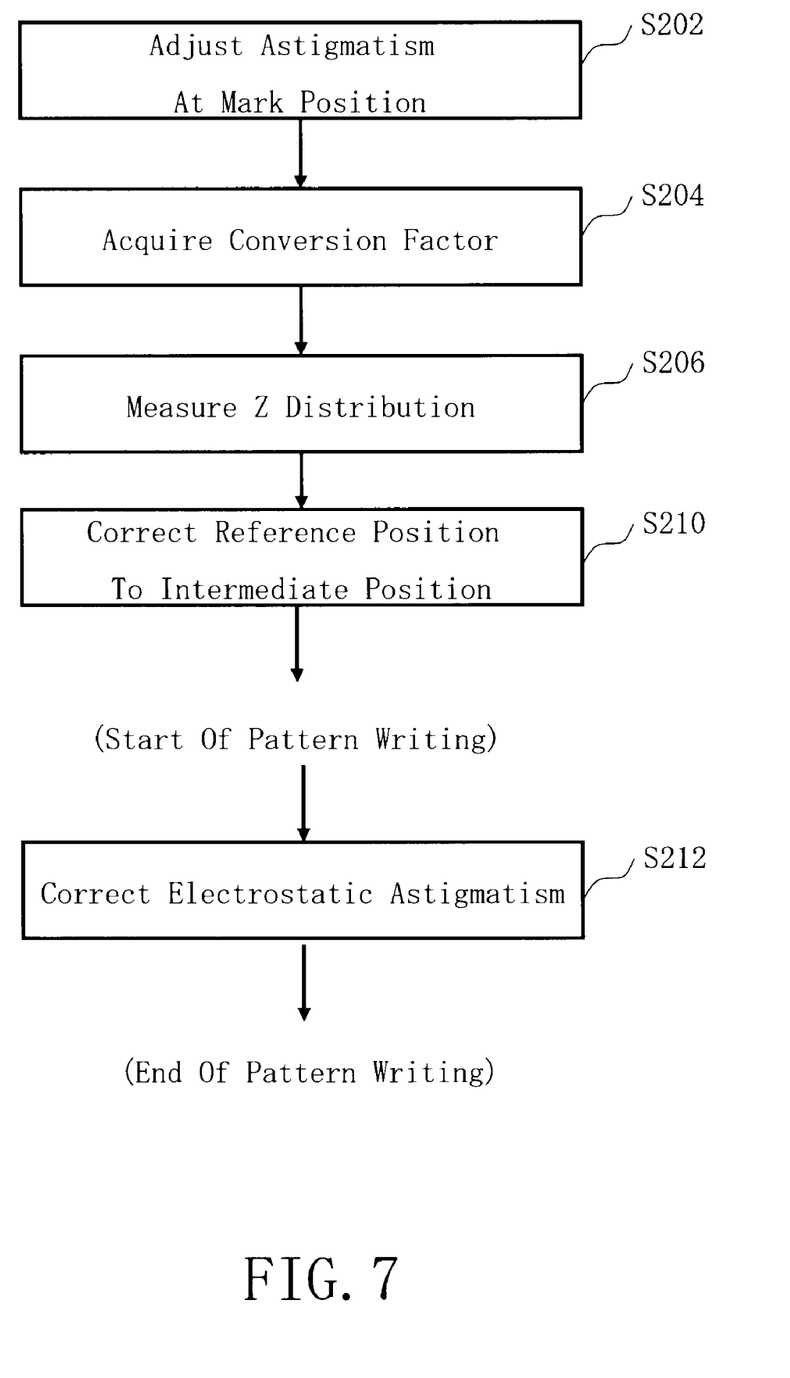
FIG. 7 is a flow chart showing main steps of a focusing method of an electron beam in a second embodiment.

FIG. 7 is a flowchart showing main steps of a focusing method of an electron beam in the second embodiment.

In FIG. 7, an astigmatism adjusting method of an electron beam execute a series of steps including an astigmatism adjusting step (S202) at a calibration mark position, a conversion factor acquiring step (S204), a Z distribution measuring step (S206), a reference position correcting step (S210) to an intermediate position, and an electrostatic astigmatism correcting step (S212).

In step (S) 202, as the astigmatism adjusting step at a calibration mark position, an astigmatism coil 212 for astigmatism adjustment is used to correct an astigmatism of the electron beam 200 at the calibration mark position. For this purpose, an astigmatism set value (first set value) to correct the astigmatism is measured (set value measuring step).

Figure 8:
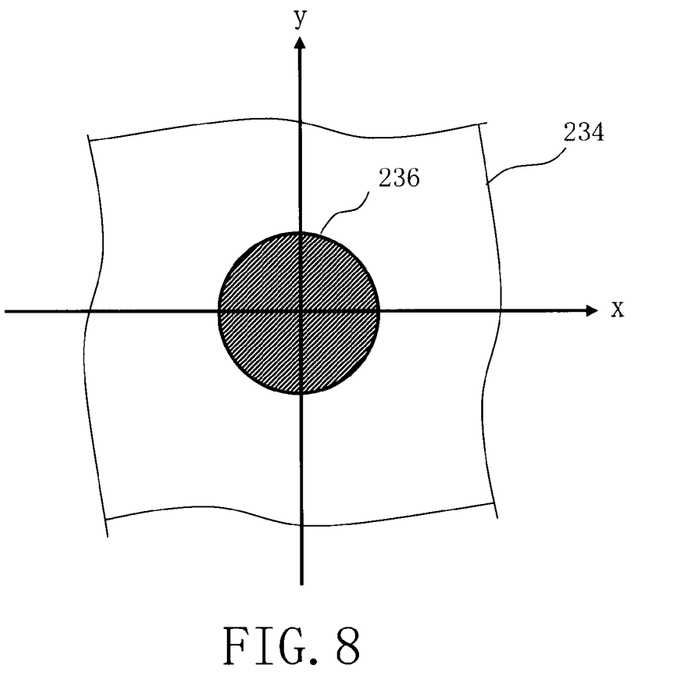
FIG. 8 is a diagram showing an example of a calibration mark in the second embodiment.

FIG. 8 is a diagram showing an example of a calibration mark in the second embodiment.

A plurality of planes 232 and 234 having different levels in a calibration mark member 106 are examples of predetermined reference planes. On each of the planes 232 and 234 of the calibration mark member 106, a calibration mark (dot mark) 236 having a circular shape when viewed from above as shown in FIG. 8 is formed. For example, a material having a reflectance higher than that of the material used in the plane 232 or 234 serving as an underlayer is used. For example, a refractory metal such as tungsten (W) or tantalum (Ta) or a heavy metal such as gold (Au) or platinum (Pt) is preferably used. For an x direction and a y direction, a set value of a lens coil 207 at a minimum resolution $\sigma$ can be obtained is calculated. As a measuring method, the same method is used as described in the focusing operation. An electron beam 200 is deflected by a deflector 205 to pass through the upper side of the calibration mark 236 in the x direction and the y direction, so that a beam profile of the calibration mark 236 in the x direction and a beam profile of the calibration mark 236 in the y direction may be measured. Alternatively, an XY stage 105 is moved in the x direction and the y direction to measure the beam profile of the calibration mark 236 in the x direction and the beam profile of the calibration mark 236 in the y direction. More specifically, the calibration mark 236 may be scanned to measure the respective beam profiles. When the same operation is performed with respect to the set values of the plurality of lens coils 207, as in the focusing operation, a relationship between the resolution $\sigma$ and the set values of the lens coils 207 can be obtained.

Figure 9:
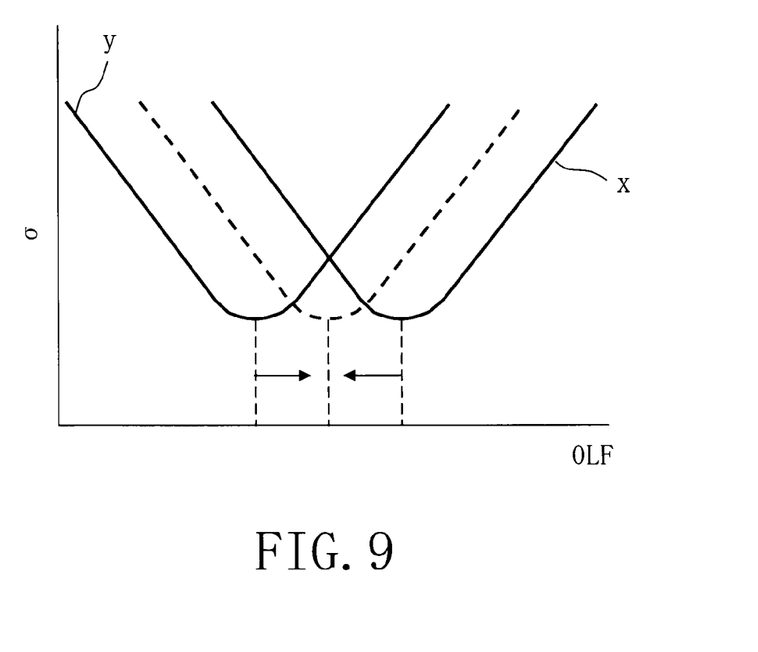
FIG. 9 is a diagram showing a relationship between a resolution and a set value of a lens coil in the second embodiment.

FIG. 9 is a diagram showing a relationship between a resolution and a set value of a lens coil in the second embodiment.

When an astigmatism is not adjusted, as shown in FIG. 9, a graph in the x direction is not equal to a graph in the y direction. For this reason, the astigmatism is adjusted by the astigmatism coil 212 such that the graph in the x direction is equal to the graph in the y direction. More specifically, the electron beam 200 is irradiated from an electron gun assembly 201. A current signal set to an arbitrary set value by an astigmatism coil control unit 160 controlled by a CPU 120 is flowed in the astigmatism coil 212. The astigmatism coil 212 is controlled by the current signal. A focal point level of the electron beam 200 is controlled by a coil operation performed by the flowed current. The set value of the astigmatism coil 212 is changed to measure data of the graphs shown in FIG. 9 again. This operation is repeated to adjust the astigmatism such that the graph in the x direction is equal to the graph in the y direction. A set value obtained when the graphs are equal to each other serves as a coil astigmatism set value (first set value).

In S204, as the conversion factor acquiring step, a first conversion factor to change a set value of an electrostatic electrode 216 depending on a distance and a second conversion factor to change a set value of the astigmatism coil 212 depending on a distance are acquired. For this purpose, by using the astigmatism coil 212, set values to correct the astigmatisms on the calibration mark 236 of each of the planes 232 and 234 of the calibration mark member 106 are measured. The set value to correct the astigmatism on the calibration mark 236 of the plane 234 of the astigmatism coil 212 is calculated in advance. For this reason, a set value to correct the astigmatism on the calibration mark 236 of the remaining plane 232 is measured. As a measuring method, an operation having the same contents as described above is also performed on the plane 232 to acquire a set value to correct the astigmatism on the calibration mark 236 of the plane 232. In this manner, a set value c1 on the plane 234 and a set value c2 on the plane 232 are acquired. As described above, the coil astigmatism values c1 and c2 can be acquired. A conversion factor k3 of the astigmatism coil 212 can be calculated as $k3=(c1-c2)/20$.

The astigmatism on the calibration mark 236 of the plane 234 is corrected by using the electrostatic electrode 216. A voltage signal output from an electrostatic electrode control unit 180 and set to an arbitrary set value is amplified by an amplifier 182 and applied to the electrostatic electrode 216. In this case, for example, a quadruple electrode is used to perform astigmatism correction in the x direction and the y direction. The astigmatism of the electron beam 200 is corrected by an electrostatic operation performed by the applied voltage. The set values of the electrostatic electrode 216 are changed to measure data of the graphs shown in FIG. 9 again. This operation is repeated to adjust the astigmatism such that the graph in the x direction is equal to the graph in the y direction. A set value obtained when the graphs are equal to each other serves as an electrostatic astigmatism set value. In this case, the lens coil 207 changes the focal point position by, for example, 10 μm which is smaller than the step between the two planes 232 and 234. Since the conversion factor k1 of the lens coil 207 is obtained in advance, the lens coil 207 can change the focal point position by only 10 μm. In this state, the electron beam is scanned by the deflector 205 to measure a beam profile of the calibration mark in the x direction and a beam profile of the calibration mark in the y direction. A set value to correct the astigmatism on the calibration mark 236 of the plane 234 is acquired. In this manner, a set value d1 on the plane 234 and a set value d2 at the position which is moved by only 10 μm are acquired. As described above, the electrostatic astigmatism set values d1 and d2 can be acquired. A conversion factor k4 of the electrostatic electrode 216 can be calculated as k4=(d1−d2)/10.

In this manner, the conversion factor k4 is acquired by using a set value to focus a charge particle beam on a predetermined reference plane by using the electrostatic electrode 216. The conversion factor k3 is acquired by using a set value to focus a charged particle beam on a predetermined reference plane by using the astigmatism adjusting coil.

In S206, as a Z distribution measuring step, a level distribution of the target object 101 plane is measured by a Z sensor. This step is the same as that in the first embodiment.

In S210, as the reference position correcting step, the set value c1 is corrected by using the conversion factor k3 to correct an astigmatism correction position of the electron beam 200 in the astigmatism coil 212 from the position of the plane 234 of the calibration mark member 106 to an intermediate level position (virtual plane) of the Z distribution of the target object 101 plane. A product of the conversion factor k3 and a distance ΔZ is added to the set value c1, a correction value c3 can be obtained. The intermediate level position is set to an intermediate position of the dynamic range of the electrostatic electrode 216.

Figure 10:
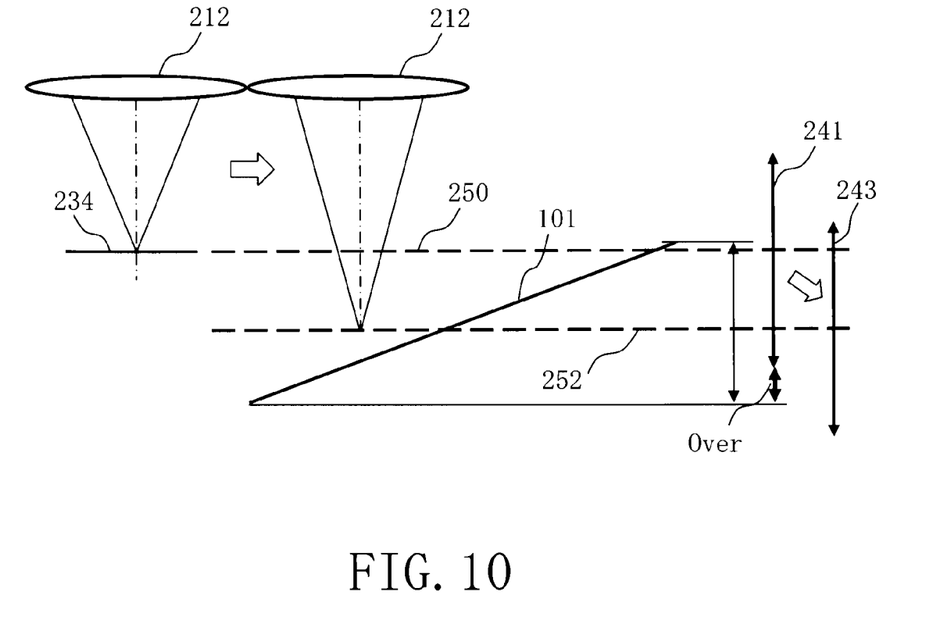
FIG. 10 is a diagram showing a relationship between a focus position and a dynamic range in the second embodiment.

FIG. 10 is a diagram showing a relationship between a focus position and a dynamic range in the second embodiment.

As described above, an astigmatism correction position of the electron beam 200 in the astigmatism coil 212 is corrected from a level position 250 of the plane 234 to an intermediate level position 252, and the position is defined as a reference position, so that a dynamic range 241 of the electrostatic electrode 216 can be moved to the position of a dynamic range 243. For this reason, even though the target object 101 plane is inclined, the entire surface can be caused to fall within the range of the dynamic range 242 of the electrostatic electrode 216. In this state, pattern drawing is started.

In S212, as the electrostatic focusing step, in pattern drawing, a level of a position of the target object 101 plane to be written is measured by the Z sensor, an electrostatic set value (second set value) of the electrostatic electrode 216 is corrected by using the conversion factor depending on the level position of the target object 101 plane, and an astigmatism of the electron beam 200 is dynamically corrected by the electrostatic electrode 216. Since the conversion factor k4 is known in advance, an electrostatic set value Δd obtained when the position of the target object 101 surface is moved from the intermediate level position 252 by a heightwise distance Δd can be given by Δd=k4·ΔZ.

With the above configuration, the position of the target object 101 plane can be arranged within the range of the dynamic range of the electrostatic electrode 216. For this reason, the astigmatism can be adjusted. Therefore, the electrostatic electrode 216 can correct the focal point position on real time while writing a predetermined pattern on the target object 101. As a result, a pattern having accurate dimensions can be written.

The embodiments are described above with reference to the concrete examples. However, the present invention is not limited to these concrete examples.

Parts such as an apparatus configuration and a control method which are not directly necessary for the explanation of the present invention are omitted. However, a necessary apparatus configuration and a necessary control method can be arbitrarily selected and used. For example, a description of a control unit configuration for controlling the pattern writing apparatus 100 is omitted. However, a necessary control unit configuration can be arbitrarily selected and used, as a matter of course.

Furthermore, all focusing methods of charged particle beams and astigmatism adjusting methods of charged particle beams which include the elements of the present invention and which can be arbitrary changed in design by a person skilled in the art are included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A focusing method of a charged particle beam comprising:
   measuring a first set value of a lens coil when the beam is focused at a reference level on a calibration mark using the lens coil;
   measuring a second set value of the lens coil when the beam is focused at an another level, which is different from the reference level, on the calibration mark using the lens coil;
   acquiring a first conversion factor for changing a focused level with the lens coil using the first set value and the second set value;
   measuring a third set value of an electrostatic lens when the beam is focused at the reference level on the calibration mark using the electrostatic lens;
   acquiring a fourth set value of the electrostatic lens when the beam is focused at an another level, at which the lens coil has changed a focal point position, using the electrostatic lens;
   acquiring a second conversion factor for changing a focused level with the electrostatic lens using the third set value and the fourth set value;
   measuring a level distribution across a surface of a target object;
   focusing the beam at an intermediate level position of the level distribution of the surface of the target object with the lens coil by correcting the first set value of the lens coil using the first conversion factor; and focusing the beam at a selected level position of the level distribution of the surface of the target object with an electrostatic lens by correcting a set value of the electrostatic lens using the second conversion factor, from the intermediate level position focused at with the lens coil.

2. The focusing method according to claim 1, wherein the intermediate level position is set to an intermediate position of a dynamic range of the electrostatic lens.

3. The focusing method according to claim 1, wherein a plurality of heights having different levels are used as the reference levels on the calibration mark.

4. The focusing method according to claim 1, wherein
the electrostatic lens corrects the focal point position of the charged particle beam in real time while writing a predetermined pattern on the target object.

5. An astigmatism adjusting method of a charged particle beam comprising:
performing two direction scans including a scan of an x direction and a scan of a y direction of a reference level on a calibration mark;
measuring a first set value of an astigmatism adjusting coil when an astigmatism of the charged particle beam is corrected at the reference level by adjusting a set value of the astigmatism adjusting coil until results of the two direction scans at the reference level are equal;
performing two direction scans including a scan of an x direction and a scan of a y direction of another level, which is different from the reference level, on the calibration mark;
measuring a second set value of the astigmatism adjusting coil when an astigmatism of the charged particle beam is corrected at the another level by adjusting a set value of the astigmatism adjusting coil until results of the two direction scans at the another level are equal;
acquiring a first conversion factor for changing a level for correcting the astigmatism of the beam with the astigmatism adjusting coil using the first set value and the second set value;
measuring a third set value of an electrostatic electrode when an astigmatism of the charged particle beam is corrected at the reference level by adjusting a set value of the electrostatic electrode until results of the two directions scans at the reference level are equal;
performing two directions scans including a scan of an x direction and a scan of an y direction of another level at which a lens coil has changed a focal point position;
measuring a fourth set value of the electrostatic electrode when an astigmatism of the charged particle beam is corrected at the another level at which the lens coil has changed the focal point position by adjusting a set value of the electrostatic electrode until results of the two directions scans at the another level at which the lens coil has changed the focal point position are equal;
acquiring a second conversion factor for changing a level for correcting the astigmatism of the beam with the electrostatic electrode using the third set value and the fourth set value;
measuring a level distribution across a surface of a target object;
adjusting an astigmatism adjusting position of the charged particle beam to an intermediate level position of the level distribution of the surface of the target object with the astigmatism adjusting coil by correcting the first set value of the astigmatism adjusting coil using the first conversion factor; and
correcting an astigmatism of the charged particle beam at a selected level position of the level distribution of the surface of the target object with the electrostatic electrode by correcting a third set value of the electrostatic electrode using the second conversion factor.

6. The astigmatism adjusting method according to claim 5, wherein the intermediate level position is set to an intermediate position of a dynamic range of the electrostatic lens.

7. The astigmatism adjusting method according to claim 5, wherein
the calibration mark is formed on each of a plurality of heights having different levels.

8. The astigmatism adjusting method according to claim 5, wherein
the electrostatic electrode corrects the astigmatism of the charged particle beam in real time while writing a predetermined pattern on the target object.

* * * * *